United States Patent [19]

Morsell et al.

[11] Patent Number: 5,089,711
[45] Date of Patent: Feb. 18, 1992

[54] LASER PLASMA X-RAY SOURCE

[75] Inventors: Arthur L. Morsell, Del Mar; Henry Shields, San Diego, both of Calif.

[73] Assignee: California Jamar, Incorporated, San Diego, Calif.

[21] Appl. No.: 627,210

[22] Filed: Dec. 13, 1990

Related U.S. Application Data

[63] Continuation of Ser. No. 467,779, Jan. 19, 1990, Pat. No. 5,003,543.

[51] Int. Cl.$^5$ ............................................. G03B 41/16
[52] U.S. Cl. .............................. 250/492.3; 250/493.1
[58] Field of Search ................. 372/5; 250/492.21, 493

[56] References Cited

U.S. PATENT DOCUMENTS

| | | |
|---|---|---|
| 3,513,402 | 5/1970 | Marrison . |
| 3,536,922 | 10/1970 | Ito . |
| 3,586,998 | 7/1971 | Gould . |
| 3,643,116 | 2/1972 | Culver et al. . |
| 3,955,153 | 5/1976 | Marie . |
| 4,151,487 | 4/1979 | Chi . |
| 4,184,078 | 1/1980 | Nagel et al. ................. 250/492.2 A |
| 4,554,666 | 11/1985 | Altman . |
| 4,575,645 | 3/1986 | Komine . |
| 4,745,618 | 5/1988 | Burger . |
| 5,003,543 | 3/1991 | Morsell et al. ......................... 372/2 |

OTHER PUBLICATIONS

Bijkerek et al., "Laser Plasma as X-ray Source for Lithographic Imaging", presented at the SPIE Symposium on Microlithography, San Jose, Calif., Feb. 26, 1989.
Eidmann et al., "Absolutely Measured X-ray Spectra from Laser Plasmas with Targets of Different Elements", Applied Physics Letter, vol. 49, No. 7, Aug. 18, 1989, pp. 377-378.
Ewing et al., "Optical Pulse Compressor Systems for Laser Fusion", *IEEE* Journal of Quantum Electronics, vol. QE-15, No. 5, May, 1979, pp. 368-379.
Frey et al., "High-Efficiency Pulse Compression with Intracavity Raman Oscillators", Optics Letters, vol. 8, No. 8, aug. 1983, pp. 437-439.
Gilbert et al., "X-Ray Yields of Plasmas Heated by 8-nsec Neodymium Laser Pulses", Journal of Applied Physics, vol. 51, No. 3, Mar. 1980, pp. 1449-1451.
Hecht, Jeff, "Aurora Laser Puts 100 TW/cm$^2$ On Target", *Lasers & Optronics*, Nov. 1989, p. 20.
"Iodine Laser Creates Plasma X-Rays", *Laser Focus World*, Jun. 1989, pp. 26-28.
Jacobs et al., "Intensification of Rare-Gas Halide Lasers with Application to Laser Fusion", *Optical Engineering*, vol. 20, No. 5, Sep./Oct., 1981, pp. 777-780.
Matsumoto et al., "X-Ray Emission from KrF Laser--Produced Al Plasmas", Applied Physics Letter, vol. 46, No. 1, Jan. 1, 1985, pp. 28-30.
Murray et al., "Raman Pulse Compression of Excimer Lasers for Application to Laser Fusion", IEEE Journal of Quantum Electronics, vol. QE-15, No. 5, May, 1979, pp. 342-368.
Smith, Henry I., "X-Ray Lithography", presented at the SPIE Symposium on Microlithography, San Jose, Calif., Feb. 26, 1989, pp. 5-10.
National Science Foundation Small Business Innovation Research Program Proposal, "Excimer-Laser Pulse-Compression Technique for Laser-Plasma X-Ray Source for X-Ray Lithography", Jun. 15, 1989.

*Primary Examiner*—Léon Scott, Jr.
*Attorney, Agent, or Firm*—Knobbe, Martens, Olson & Bear

[57] ABSTRACT

A laser plasma X-ray source for use in photolithography is disclosed wherein an electro-optical shutter is used to trim the output pulse from a master oscillator to a desired duration. The pulse is then split into several pieces which travel along various optical delay paths so that the pieces pass sequentially through a laser power amplifier. After amplification, the pieces are reassembled and then focussed at the plasma target. In a first embodiment, polarization and angle coding methods are used to distinguish each pulse piece at it travels along the delay paths. In a second embodiment, polarization coding is replaced by additional angle coding transverse to the plane of the angles of the first embodiment. An expander/reducer lens assembly is used in both embodiments to reduce the angles between the beam paths and allow more beams to fit closely to the laser amplifier gain region.

35 Claims, 11 Drawing Sheets

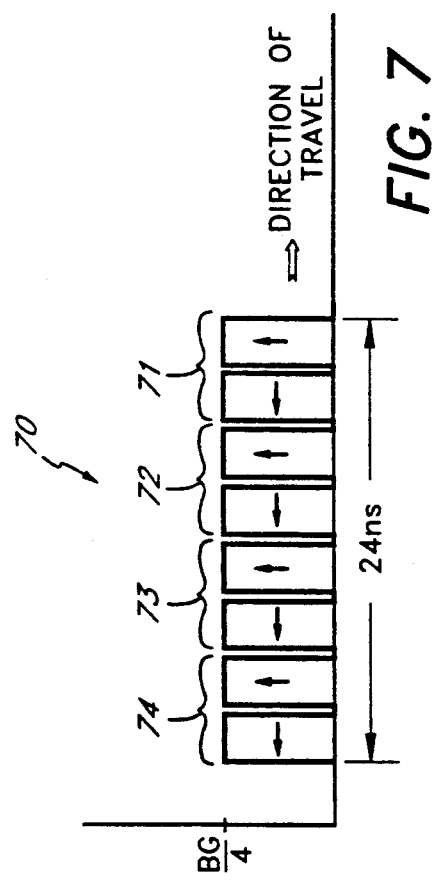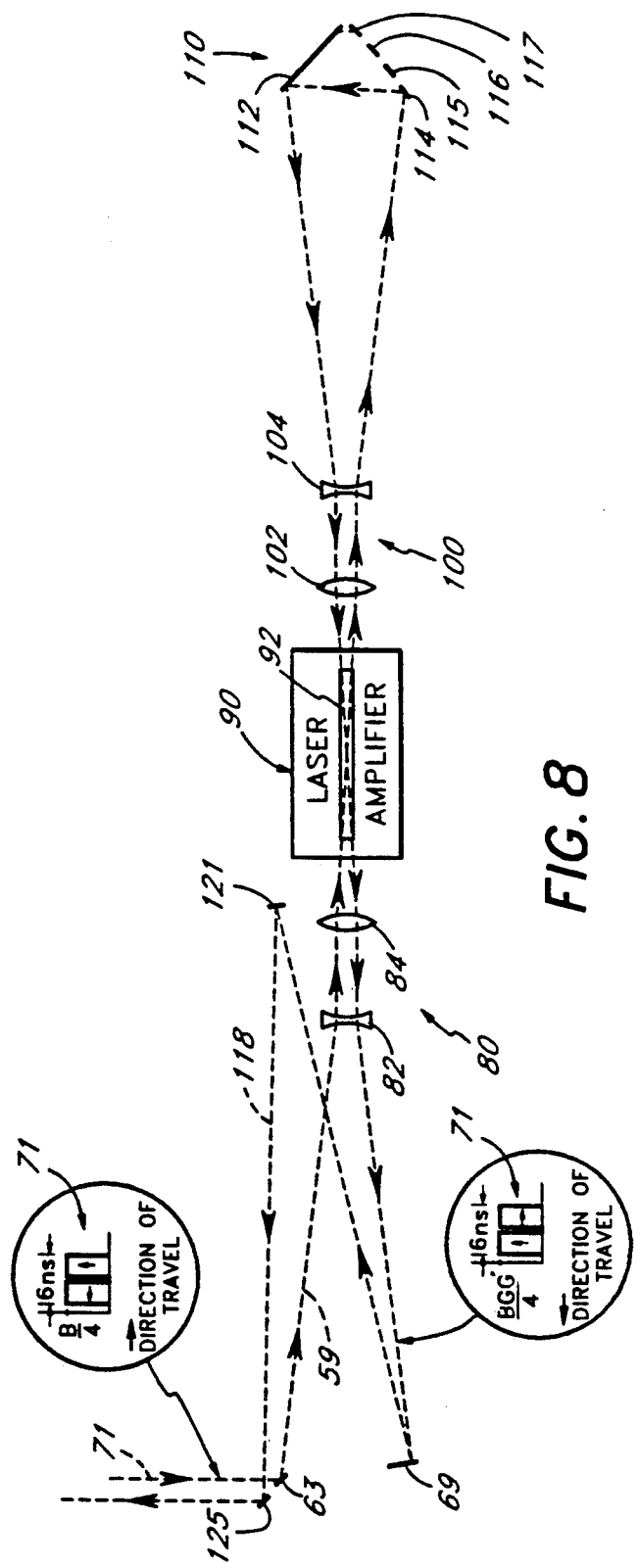

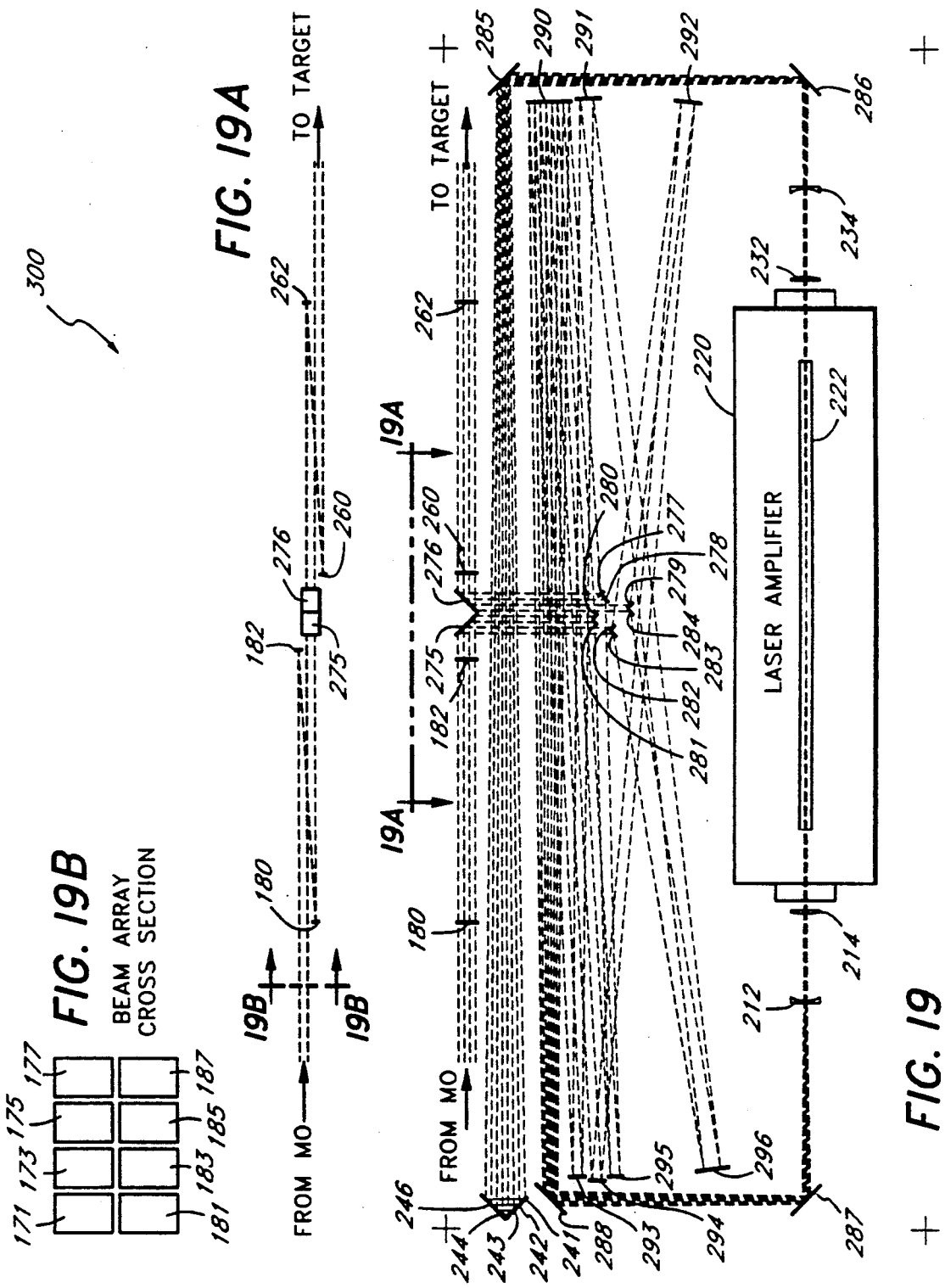

LASER PLASMA X-RAY SOURCE

This application is a continuation of application Ser. No. 467,779, filed Nov. 19, 1990, now U.S. Pat. No. 5,003,543.

FIELD OF THE INVENTION

The present invention generally relates to systems which produce X-rays from plasmas and, in particular, to those systems which generate a hot plasma by focussing an intense, short-duration light pulse from a laser onto a target. In this type of X-ray source, the concentrated energy contained in the focussed laser beam effectively vaporizes the target material, raising it to such extreme temperatures that the vapor atoms are multiply ionized and X-rays are emitted when free electrons in the plasma recombine with the ions in the plasma. One application for plasma generated X-rays is in the field of lithography.

BACKGROUND OF THE INVENTION

In photolithography processes, light is passed through a mask having a desired pattern onto a light-sensitive substrate. Diffraction effects can degrade the replication when the mask includes fine-scale features comparable to the wavelength of light, typically on the order of one fourth ($\frac{1}{4}$) to one half ($\frac{1}{2}$) micrometer. Recently, much attention has been focused on the use of X-rays for lithography applications since X-rays have much shorter wavelengths. Thus, X-ray lithography is one of the leading techniques being considered for producing the next generation of micro-electronic components.

Several sources for the production of X-rays for use in lithography have been developed. Electron-impact X-ray sources generally produce high-energy X-rays which are not stopped in the resist layer and can continue on to damage the substrate material. Synchrotron sources emit softer X-rays but are limited by high cost and large physical dimensions. Laser produced X-rays have been tested but have thus far yielded poor performance and efficiency.

It is generally known that X-rays having high light-to-X-ray conversion efficiencies can be produced if four criteria are satisfied: (1) the laser pulse intensity is greater than approximately 6 TW/sq cm. at the focussed spot on the target; (2) the focal spot is not so small that the expansion of the plasma causes rapid cooling; (3) the wavelength of the laser radiation is short enough to optimize the coupling between the laser pulse and the plasma target; and (4) an approximate target material is chosen.

The criteria outlined above may be met by more than one type of laser, including solid state and discharge-pump rare-gas-halide lasers. Discharge-pumped rare-gas-halide lasers, more commonly referred to as excimer lasers, produce pulses of shorter wavelength than solid-state lasers and allow more efficient coupling to the plasma target. Unfortunately, the pulses produced are generally too low in energy and too long in duration to give the instantaneous peak power required to produce a sufficiently high plasma temperature. As a result of low peak power, prior systems which generate X-rays using discharge-pumped lasers have yielded poor conversion efficiency. A laser of this type would require compression of the output pulse by an order of magnitude to produce the instantaneous intensity required for adequate light-to-X-ray conversion efficiency.

Presently, excimer lasers having pulse widths in the nanosecond range are available. However, the power output of these short pulse lasers is too low for generation of a plasma which will emit X-rays useful in lithography applications. On the other hand, the high power lasers produce pulses which are too long in duration to be useful in X-ray generation. It is generally believed that nanosecond length pulses are required for generation of X-rays from a plasma to allow the laser power to be put in the plasma before the plasma expands excessively.

SUMMARY OF THE INVENTION

The pulse compression technique of the present invention uses an electro-optical shutter which trims the output pulse provided by a master oscillator to a desired duration. The pulse is then split into several pieces which are sequentially passed through a laser power amplifier. After amplification, the pieces are reassembled into a single short pulse which is focussed at a predetermined focal spot on a laser-plasma target.

In order to introduce and then remove the necessary delays between the laser pulse pieces before and after propagation through the amplifier, separate paths, distinguishable by angle, are constructed for each pulse piece. The physical limitations of these systems, in particular, the required magnitudes of the angles in the optical delay paths, have heretofore either limited the realizable pulse compression ratios to small values or resulted in large, awkward, and complicated configurations. A poor degree of overlap between the angled beams from the master oscillator and the gain region of the amplifier can result in serious losses of laser energy. Since the gain medium of an excimer laser is known to be unable to store energy for more than a few nanoseconds, some of the available energy in the gain medium is wasted if the beams fail to fill the gain region for an appreciable fraction of the duration of the discharge. Furthermore, for beams with paths angled with respect to the electrode surfaces, additional energy is lost when the edges of the beams strike the laser amplifier electrodes.

The present invention provides a solution which shortens the output pulse of a high power excimer laser to a value which will produce the required intensity at the focal spot of the plasma target. The invention advantageously achieves this reduction in pulse duration without the substantial loss in output energy often associated with prior pulse compression techniques.

More specifically, in one embodiment, the system uses polarization to distinguish and separate pulses during the introduction and removal of the delays, thus reducing the number of angled paths required for a given compression ratio. In addition, the system advantageously utilizes an optical beam expander/reducer assembly to reduce the angular difference between the beams as they travel through the laser gain region and thus to allow more beams to pass through the amplifier without problems resulting from poor overlap with the gain region.

In an alternate embodiment, instead of separating the multiple pulses into two groups distinguishable by polarization, the pulses travel in two distinguishable planes. The number of mirrors required can be reduced by half since the pulses can travel along substantially similar paths in each plane. The expander/reducer lens assembly is again used in this embodiment to reduce the angular difference between the beam paths through the laser amplifier to allow more beams to be amplified.

The present invention provides a plasma-generated X-ray source comprising a laser pulse generator for making a template laser pulse wherein the template laser pulse has a time duration equal to a first time period. The source further includes a laser amplifier medium having an excited region which is excited for a time duration equal to a second time period wherein the second time period is longer than the first time period, such that when the template pulse propagates in the excited region of the medium, energy is transferred from the laser medium to the template pulse, thereby increasing the energy of the template pulse producing an amplified template pulse having a time duration substantially equal to the first time period.

An optical transport system delivers the amplified template pulse to a target material causing the target material to form a plasma from which X-rays are emitted. The X-ray source may further comprise a pulse train generator for generating a series of sequential pulses from the template pulse, wherein the series of sequential pulses has a total time duration equal to a third time period which is greater than the first time period. The pulse train generator may comprise a beam splitter for dividing the template pulse into a plurality of secondary template pulses which propagate along a plurality of optical paths and an optical delay for introducing time delays between at least two of the secondary template pulses. The optical delay may comprise a plurality of optical delays wherein each of the plurality of delays has a time duration equal to an integral multiple of the first time period. Furthermore, the laser amplifier medium may be an excimer laser.

In an alternate embodiment, a plasma-generated X-ray source is disclosed comprising a pulse train generator which creates a pulse train comprising a series of individual pulses which are sequential in time, wherein the individual pulses are separated in time by a series of delay times and wherein each of the individual pulses has a time duration equal to a first time period. The X-ray source also includes a laser amplifier medium having an excited region with an axis, wherein the excited region remains excited for a time duration equal to a second time period and wherein the second time period is longer than the first time period, such that when any of the individual pulses propagates in the excited region of the medium, energy is transferred from the laser medium to the pulse thereby increasing the energy of the individual pulse creating an amplified pulse having a time duration approximately equal to the first time period.

An angle encoder is provided for defining a plurality of optical paths wherein each of the plurality of paths forms a different angle with respect to the axis of the laser amplifier excited region and wherein different individual paths transmit different ones of the individual pulses through the excited region. A pulse train compressor removes the series of delay times between the individual amplified pulses. An optical transport system delivers the amplified pulses to a common location on a target thereby forming a plasma from which X-rays are emitted. The angle encoder may further comprise a convex lens having a focal point at a first focal length and a concave lens having a focal point at a second focal length wherein the second focal length is less than the first focal length and wherein the convex lens focal point substantially coincides with the concave lens focal point. The laser amplifier medium may be an excimer laser.

In yet another embodiment, a plasma-generated X-ray source is disclosed comprising a pulse train generator which creates a pulse train comprising a series of individual pulses which are sequential in time. The X-ray source additionally comprises a laser amplifier medium having an excited region wherein energy is transferred from the laser medium to the pulse train when the pulse train propagates through the excited region and a pulse encoder which encodes each of the individual pulses comprising the pulse train. The source further includes a pulse train compressor for transforming the pulse train from a series of pulses sequential in time to a group of pulses coincident in time and an optical transport system for delivering the coincident in time pulses to a common location on a target thereby forming a plasma from which X-rays are emitted. The pulse encoder may comprise an angle encoder which defines a plurality of optical paths wherein each of the plurality of paths forms a different angle with respect to an axis of the laser amplifier excited region and wherein different individual paths transmit different ones of the individual pulses of the pulse train through the excited region. The angle encoder may further comprise a convex lens having a focal point at a first focal length and a concave lens having a focal point at a second focal length, wherein the second focal length is less than the first focal length and the convex lens focal point substantially coincides with the concave lens focal point. Additionally, the pulse encoder may comprise a polarization encoder which identifies individual pulses by their polarization. The laser amplifier medium may be an excimer laser.

The plasma-generated X-ray source disclosed may comprise a high power pulsed laser having a first pulse length and a pulse compressor for compressing the temporal width of the pulsed laser to produce an energetic laser pulse having a second pulse length wherein the second pulse length is smaller than the first pulse length. An optical transport system delivers the energetic laser pulse to a location on a target thereby forming a plasma from which X-rays are emitted. The high powered pulsed laser may comprise a repetitively pulsed excimer laser. Additionally, the source may further include a master oscillator which produces a template pulse having a third pulse width wherein the template pulse is amplified by the high power pulsed laser to produce the energetic laser pulse having a pulse width substantially equal to the third pulse width. The source may further include a pulse trimmer for trimming the template pulse wherein the pulse trimmer may comprise a dielectric breakdown switch or saturable absorber optical switch.

The source may utilize a Pockels cell and a polarizer to trim said template pulse and further comprise a splitter for splitting the template pulse into a plurality of secondary pulses and a delay for giving the plurality of secondary pulses a plurality of delay times so that the plurality of secondary pulses can be passed through the high power pulsed laser sequentially. A pulse assembler may be included for reassembling the plurality of secondary pulses to produce the energetic laser pulse. Reversing optics may be included for causing the plurality of secondary pulses to be passed sequentially through the high power pulsed laser more than once and may further comprise a pulse assembler for reassembling said plurality of secondary pulses to produce an energetic laser pulse. The X-ray source may additionally comprise a time delay which causes a trailing pulse of the plurality of secondary pulses and a leading pulse of the plurality of secondary pulses to overlap in a gain region of the high power pulsed laser for a period of time which ensures that extraction of energy from the gain region proceeds in a continuous manner during the period of time the gain region is occupied by the multiple passes of the plurality of secondary pulses.

The X-ray source may further comprise an angle encoder which defines a plurality of optical paths through a gain region of the high power pulsed laser wherein the plurality of optical paths are configured so that the plurality of secondary pulses are distinguished and separated one form the other by means of the differing path angles through the gain region. The source may also include a polarization encoder which enables the plurality of secondary pulses to be distinguished and separated one from the other as they pass through the gain region.

A method of producing X-Rays is disclosed comprising the steps of compressing the temporal width of a high energy pulsed laser having a first pulse length into an energetic laser pulse having a second pulse length wherein the second pulse length is smaller than the first pulse length and directing the energetic laser pulse to a target thereby forming a plasma from which X-rays are emitted.

An alternative method comprises the steps of exciting a laser material in pulses having a first pulse length, extracting energy from the excited laser material in the form of an energetic laser pulse having a period which is smaller than the first pulse length, and directing the energetic laser pulse to a target thereby forming a plasma from which X-rays are emitted.

A method of producing X-Rays is disclosed comprising the steps of producing a laser pulse having a first pulse length, compressing the temporal width of the laser pulse to produce an energetic laser pulse having a second pulse length wherein the second pulse length is smaller than the first pulse length and delivering the energetic laser pulse to a location on a target thereby forming a plasma from which X-rays are emitted. The compressing step may further comprise the steps of producing a template pulse, splitting the template pulse into a plurality of secondary pulses, delaying the plurality of secondary pulses a plurality of delay times to produce a pulse train having a pulse train period, sequentially passing the plurality of secondary pulses through an excited laser medium having an excitation period which is longer than the first pulse length thus increasing the energy of the secondary pulses, and reassembling the plurality of increased energy secondary pulses to produce the energetic laser pulse. The step of sequentially passing the plurality of secondary pulses through said excited laser medium may be repeated.

An alternate method for amplifying and time compressing laser pulses is disclosed comprising the steps of exciting a lasing medium having an energy-storage time period, producing a train of pulses wherein each pulse in the train has a width equal to a first time period and wherein adjacent pulses are separated by a period of time equal to a second time period wherein the second time period is no greater than the energy-storage time period of the lasing medium, and transporting the train of pulses through the lasing medium.

In addition, an X-ray lithography process is disclosed comprising the steps of producing a laser pulse having a first time width, transferring energy from a lasing medium which is excited in pulses having a duration equal to an excitation time period to the laser pulse wherein the laser pulse first time width is less than the excitation time period thereby amplifying the laser pulse, bombarding a target material with the amplified laser pulse to produce a plasma from which X-rays are emitted, and exposing a mask/X-ray-resist substrate combination to the X-rays to replicate a desired pattern on the substrate.

BRIEF DESCRIPTION OF THE DRAWINGS

FIG. 7 is a diagram of the pulses as they appear after the first pass through the laser amplifier;

FIG. 8 illustrates the optical paths travelled by one pulse piece in the system of FIG. 2;

FIG. 19A, FIG. 19B, and FIG. 19C show a compact arrangement of the system of FIG. 12.

DETAILED DESCRIPTION OF THE INVENTION

Figure 1:
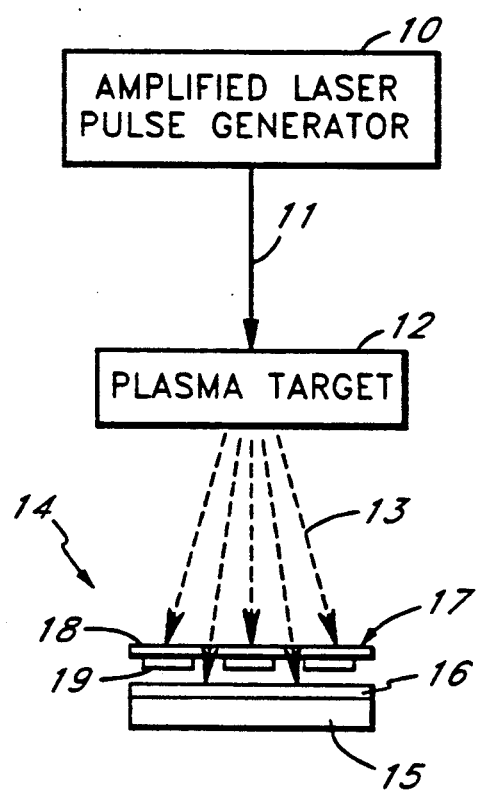
FIG. 1 is an illustration of a photolithographic system incorporating the laser plasma X-ray source of the present invention.

As shown in FIG. 1, one embodiment of the present invention provides an amplified laser pulse generator 10 for application in X-ray lithography systems. In such systems, the laser pulse generator 10 outputs a short, high-energy laser pulse 11 which is focused at a plasma target 12. The concentrated energy contained in the focussed laser beam 11 effectively vaporizes the target 12 and raises the target 12 to extreme temperatures such that X-rays, generally designated 13, are emitted from the plasma 12. The X-rays 13 are incident upon a lithography structure 14. The structure 14 includes a substrate 15, such as silicon, a layer of X-ray resist 16 which is positioned on the substrate 15, and a mask 17 positioned over the resist 16. The mask 17 includes a supporting layer 18 which supports a pattern 19.

The X-rays 13 incident upon the support layer 18 of the mask 17 are blocked by those areas of the mask 17 having a pattern 19 and transmitted through the areas of the mask 17 without a pattern 19. In this manner, the X-rays reaching the resist 16 sensitize the resist 16 in a pattern of sensitization corresponding to the pattern 19 on the mask 17, so that when the resist 16 is subjected to a development process, normally a process involving the action of a solvent on the resist 16, resist material is selectively removed to leave a resist pattern on the substrate 15. Depending on the type of resist 16 used, this pattern is either identical to the mask pattern 19 or is the negative version of the mask pattern 19. The resist pattern is then used to control some subsequent process applied to the substrate.

Other types of X-ray lithography are also know including a type in which the pattern on a mask is projected onto a resist covered substrate using X-ray optics. This type of X-ray lithography will also benefit from the techniques of the present invention.

Figure 2:
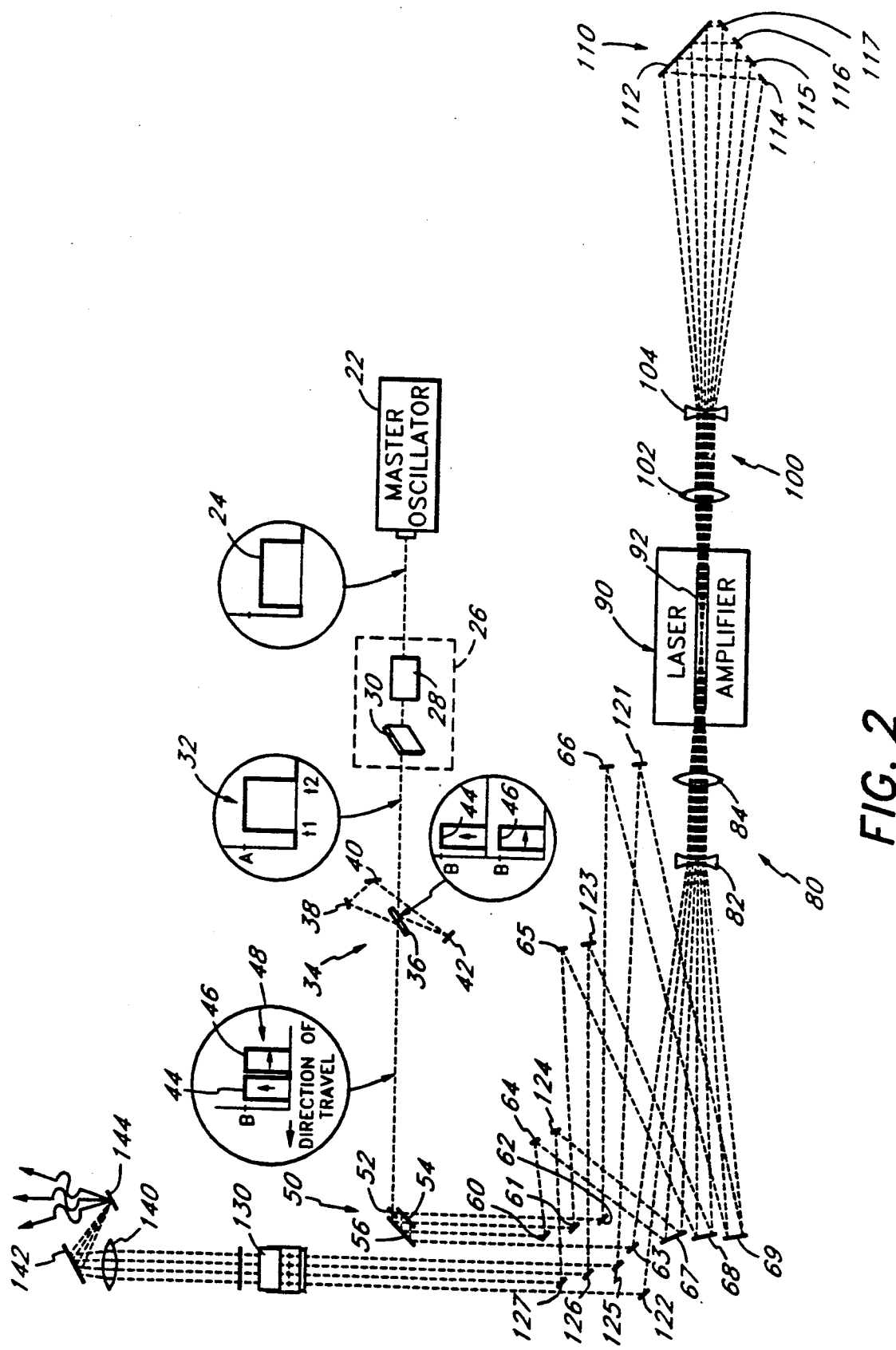
FIG. 2 shows a first embodiment of the laser plasma X-ray source of the present invention.

A laser plasma X-ray source system 20 constructed in accordance with the present invention is shown in FIG. 2. The system 20 includes a master oscillator laser, generally designated 22. Following the master oscillator laser 22 is a pulse slicer 26 comprising a Pockels cell 28 and a polarizing beam splitter 30. One skilled in the art will recognize that other types of optical switches could be used to trim the master oscillator pulse. For example, a dielectric breakdown switch or a saturable absorber switch would be suitable. The system 20 also includes a polarization component shifter assembly 34 comprising a polarization beam splitter 36 and three reflecting mirrors 38, 40, and 42. A path splitter assembly 50 comprising two non-polarizing beam splitter 52, 54 and a mirror 56 is positioned to follow the shifter assembly 34. A plurality of forward delay paths are located between the assembly 50 and an expander/reducer lens assembly 80. The expander/reducer assembly 80 comprises a concave lens 82 in combination with a convex lens 84 in a configuration commonly referred to as a Galilean telescope. A laser amplifier 90 having a gain region 92 is positioned between the first expander/reducer assembly 80 and a second expander/reducer assembly 100. The expander/reducer assembly 100 is similar to the assembly 80 but has the order of the lenses reversed. Assembly 100 comprises a convex lens 102 followed by a concave lens 104. A plurality of turning mirrors 110 are positioned following the second expander/reducer assembly 100. A series of reverse delay paths are positioned between the first expander/reducer assembly 80 and a polarization component recombination assembly 130. A focussing lens 140 and mirror 142 are located between the recombination assembly 130 and a target 144.

In operation, the master oscillator 22 outputs a laser pulse designated 24 having a duration generally longer than three nanoseconds. The beam 24 is polarized and has a polarization direction 25, shown in FIG. 3, which is at a 45-degree angle with respect to a horizontal axis 23. Upon entering the Pockels cell 28, the beam 24 undergoes a 90-degree rotation in polarization such that the polarization is now represented by a vector 29 which is at a 45-degree angle with respect to the vertical axis 27. As known to those skilled in the art, grounding a voltage on an electrode in the Pockels cell 28 removes the 90-degree rotation in polarization direction thereby changing the direction of polarization of the beam 24 back to its initial polarization direction 25. The polarization beam splitter 30 is oriented so that it blocks, i.e. reflects polarization direction 29 and passes, i.e. transmits polarization direction 25. Thus, when the Pockels cell 28 is grounded, beam 24 is passed through the polarization beam splitter 30. By grounding the voltage in the Pockels cell 28 for a specified time period, for example, three nanoseconds, the Pockels cell 28 and polarizing beam splitter 30 function as a high-speed shutter and trim the output beam 24 of the master oscillator 22 to a preferred three-nanosecond duration template pulse 32.

Figure 3:
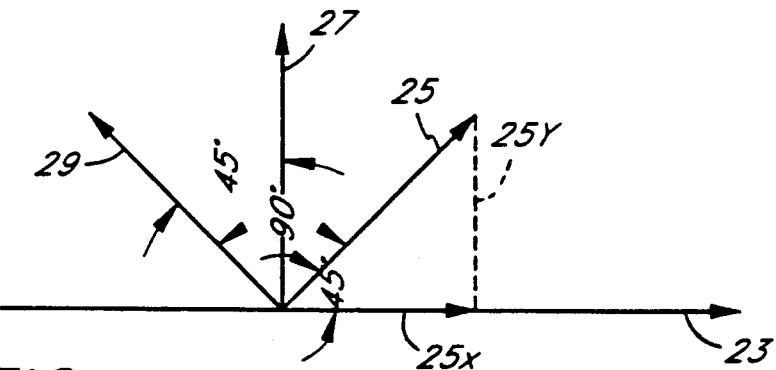
FIG. 3 is a diagram of the polarization directions of the system shown in FIG. 2.

The template pulse 32 begins at some time t1 and end at some time t2 such that the difference between t1 and t2 is three nanoseconds, i.e. t2−t1 is three nanoseconds, and has an intensity level A. After exiting the pulse slicer 26, the template pulse 32 next enter the polarization component shifter assembly 34. Referring to FIG. 3, the assembly 34 has principal polarization directions defined by horizontal and vertical axes 23 and 27. More specifically, the polarizing beam splitter 36 is oriented so that it reflects pulses having polarization direction 23 and transmits those with polarization direction 27. The template pulse 32 entering the assembly 34 and the beam splitter 36 has polarization direction 25 which is at a 45-degree angle with respect to the principal polarization directions 23 and 27. The vector 25 has a polarization component 25x in the horizontal polarization direction 23 and a component 25y in the vertical polarization direction 27 which add under the principles of vector addition to produce a resultant vector 25. When the template pulse 32 enters the beam splitter 36 having polarization directions 23 and 27 as described above, the template pulse 32 is split into two separate pulses 44, 46 having equal intensity but orthogonal polarization directions represented by vector components 25x and 25y. The pulse 44 having polarization component 25y in the direction of polarization 27 passed by the beam splitter 36, passes through. The pulse 46 having component 25x is in the polarization direction 23 which is reflected by the beam splitter 36 and, therefore, it also is reflected by the beam splitter 36.

The reflected pulse 46 is directed around the beam splitter by mirrors 38, 40, and 42. The mirrors 38, 40, and 42 are positioned to give enough travel distance to the reflected pulse 46 to delay it for a time period which is approximately equal to its duration, i.e., three nanoseconds. A delay of three nanoseconds requires an additional travel distance of approximately three feet. With the delay equal to the pulse duration, the second, or reflected pulse, 46 exits the assembly 34 directly after the passed pulse 44 and a pulse train 48 is formed. Thus, the pulse train 48 exiting the beam splitter 36 consists of two three-nanosecond pulses 44 and 46 having orthogonal polarization directions. The gaps shown between pulses in the figure and other figures referenced hereinafter are only for illustrative purposes to distinguish between the pulses and are not intended to represent any specific separation in time.

Figure 4:
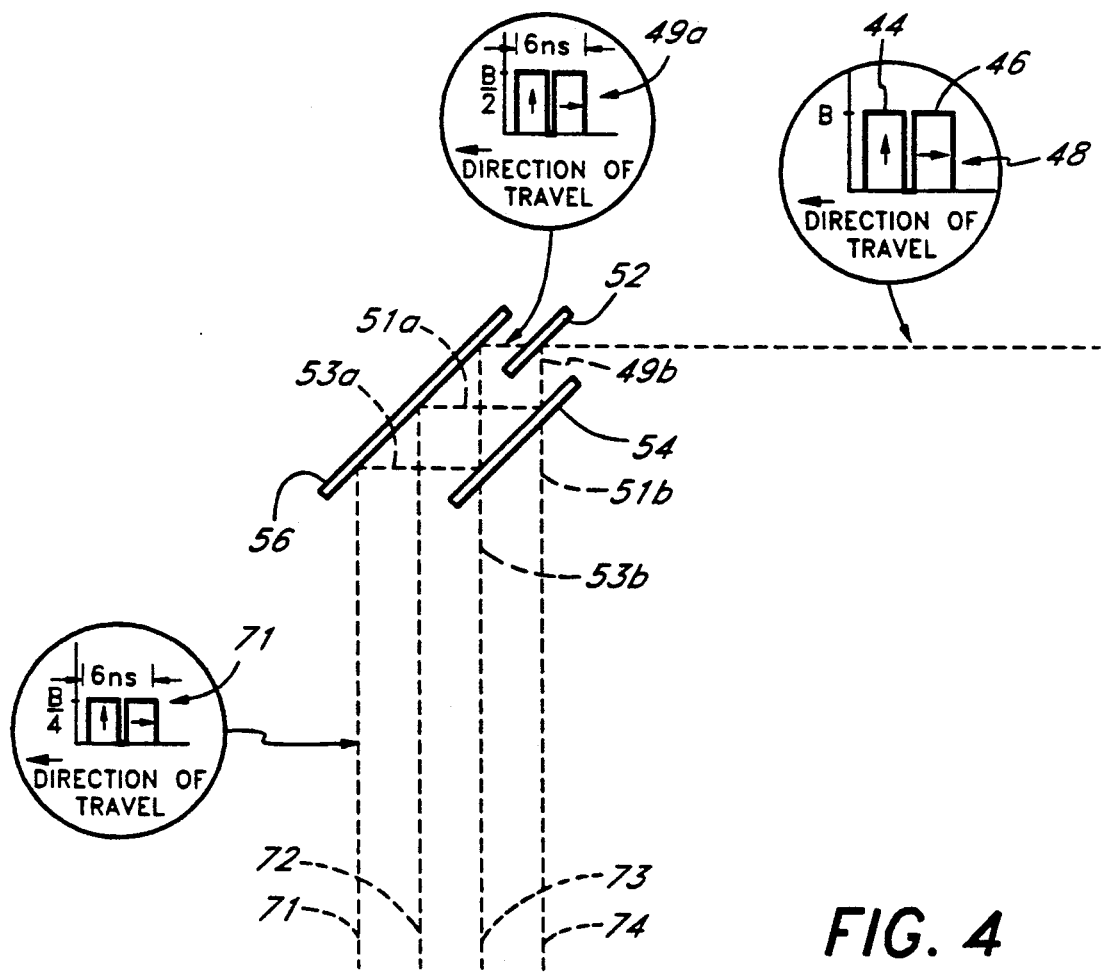
FIG. 4 is an enlarged view of the beam splitter assembly of FIG. 2.

The two pulses 44, 46 comprising the pulse train 48 next encounter the beam splitter assembly 50, shown enlarged in FIG. 4, which, as explained hereinafter, produces four pulse pieces of approximately equal intensity. The pulse train 48 enters the assembly 50 with intensity B and first encounters beam splitter 52 which splits the train 48 into two pulse pieces 49a and 49b and reduces the intensity by a factor of approximately two. As shown, piece 49a comprises a six nanosecond train of two three-nanosecond pulses having orthogonal polarization directions. Piece 49b is identical to piece 49a as shown. Pulse piece 49b is then directed toward beam splitter 54 where it is split into two more pieces 51a and 51b each having half the intensity of piece 49b. Piece 51b exits the assembly 50 as pulse piece 74 shown at the far right. Piece 52a hits the mirror 56 and is deflected 90 degrees and then exits the assembly as piece 72. Pulse piece 49a hits mirror 56 where it is deflected by 90 degrees towards the second beam splitter 54. When pulse train 49a enters the beam splitter 54 it is split into two more pulse trains 53a and 53i b identical to pieces 51a and 51b. Piece 53a then exits the assembly as piece 71 at the far left. Piece 53b hits the mirror 56 and is deflected 90 degrees such that it exits the assembly as piece 73. As shown, pulse piece 71 comprises a 6 nanosecond train of two three-nanosecond pulses and has been reduced twice in intensity for an overall reduction in intensity of approximately ¼ and a resulting intensity level of approximately B/4. Since the beam splitters 52 and 54 in the assembly 50 are non-polarizing, the polarization directions of the pulses are unaffected and thus piece 71 further comprises two three-nanosecond pulses wherein each pulse has orthogonal polarization directions. The other pulses pieces 72, 73, and 74, produced by the assembly 50 are identical to piece 71 as shown.

Figure 5:
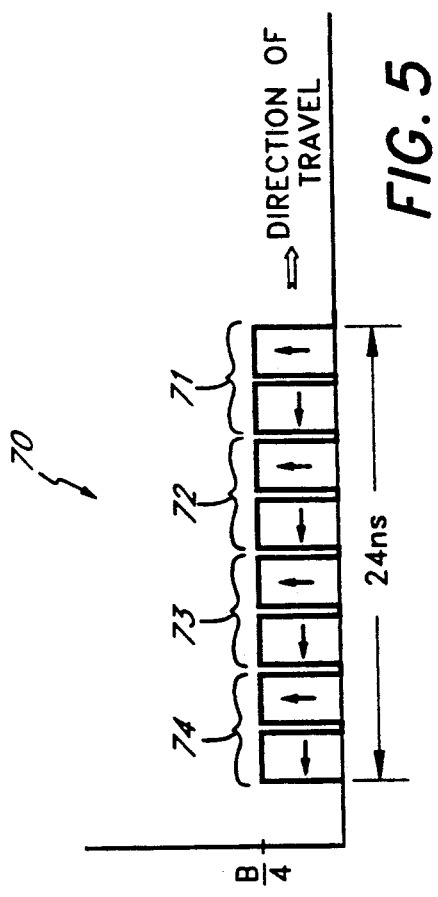
FIG. 5 is a diagram of the pulses as they appear before entering the expander/reducer lens assembly.

As shown in FIG. 2, after exiting the beam splitter assembly 50, the pulse pieces 71, 72, 73, and 74 encounter a plurality of forward optical delay paths comprising mirrors 60-69. Each delay path has a different length which introduces a different delay as the pulse pieces 71, 71, 73, and 74 proceed toward the expander/reducer lens assembly 80 and on to the laser amplifier 90. The values of the delays are chosen such that the four pulse pieces 71, 72, 73, and 74 produced by the assembly 50 arrive sequentially at the laser amplifier 90 stacked end-to-end, i.e., the delays are configured so that the pulse piece 71, shown at the far left after exiting beam splitter assembly 50 in FIG. 4, receives the least amount of delay and piece 74, shown at the far right, receives the most delay. FIG. 5 illustrates the train 70 comprising pulse pieces 71, 72, 73, and 74 as it enters the assembly 80. In this manner, the laser amplifier 90 experiences a continuous train of pulses 70, 24-nanoseconds long, made up of the four six-nanosecond pieces 71, 72, 73, and 74 which were stacked using the optical delay paths comprising mirrors 60-69. Before entering the amplifier 90, the pulse train 70 passes through the beam expander/reducer assembly 80. As shown in the enlarged diagram in FIG. 6, the expander/reducer assembly 80 comprises a convex and concave lens pair with the concave lens 82 having a shorter focal length than the convex lens 84. The lenses 82, 84 coincide. The pulse train 70 enters the concave lens 82 in four separate beams of parallel rays at four district angles with respect to an optical axis 87 of the lenses 82, 84. Upon exiting the convex lens 82, the four beams still comprise rays which are parallel with respect to themselves, but now each beam is wider than it was before it entered the assembly 80 and each beam now has a second, smaller angle with respect to the optical axis 87. In accordance with the properties of the lenses 82, 84, the height and width are increased by a factor equal to the ratio of the focal lengths of the lenses 82, 84 and the changes in angle are inversely proportional to the changes in width. As explained below, the combined effect of these changes in beam angle and size is a larger than expected net reduction in beam angle in the amplifier 90 for a given set of path lengths outside the amplifier 90. The use of the beam expander/reducer assembly 80 which produces, for example, a factor of two change in beam width, results in a factor of four reduction in angles between the beams in the amplifier gain region 92, thus making it much easier to fit many angled beams through the amplifier 90.

Figure 6:
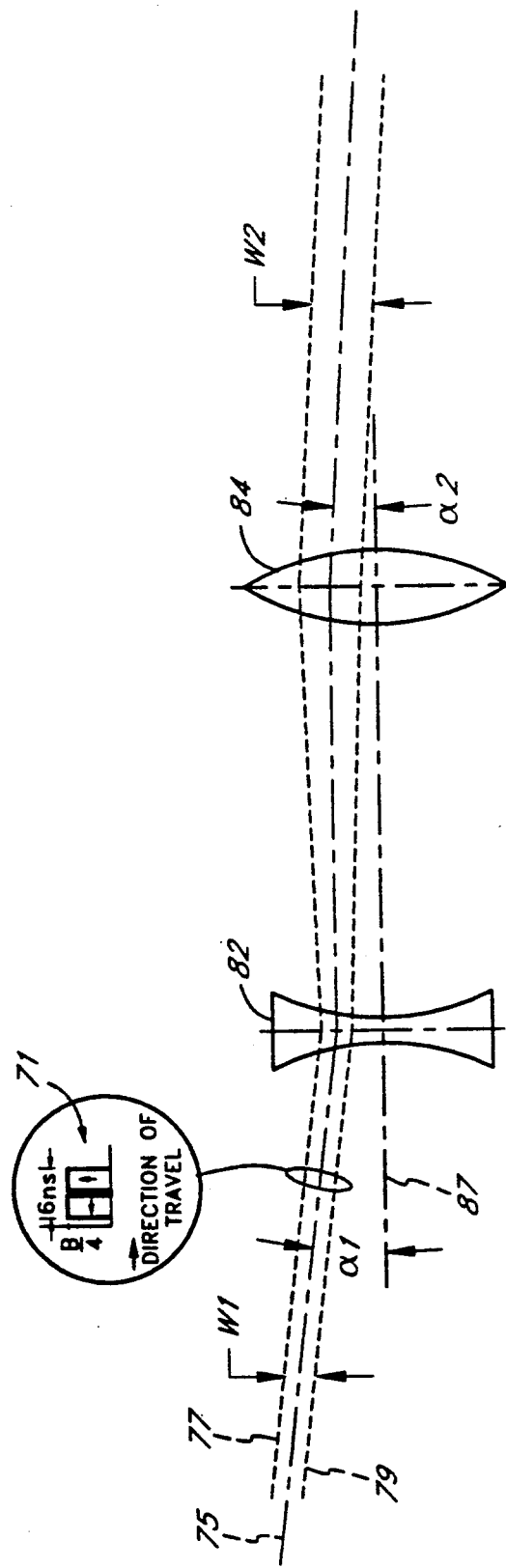
FIG. 6 is an enlarged view of the beam expander/reducer lens assembly of FIG. 2.

For example, as shown in FIG. 6, pulse piece 71 travels along an optical path 75. The piece 71 comprises a collimated beam of parallel rays and has a width defined by rays 77 and 79. The pulse 71 enters the concave lens 82 at an angle $\alpha 1$ with respect to the optical axis 87 and has a width w1. When the pulse 71 exits the convex lens 84, it has and angle $\alpha 2$ with respect to the optical axis 87 such that $\alpha 2$ is less than $\alpha 1$. Furthermore, the exiting pulse 71 has a height and width w2 which is greater than the height and width w1 at the entrance to the concave lens 82. Although only one pulse piece 71 shown entering the lens assembly 80, one skilled in the art will recognize the effects of the lens assembly 80 are the same for the remaining pulses in the train 70.

For efficient extraction of energy from the lasing medium, the beam widths and heights in the amplifier 90 must be approximately equal to the width and height of the gain region 92. The increase in beam width experienced by the incoming pulses permits smaller beam dimensions outside the amplifier 90. Smaller dimensions outside the amplifier lead to a reduction in beam path angles because the mirrors 63, 67, 68, 69 can then be smaller and closer together. Since these small beam path angles are reduced further as the pulses pass through the expander/reducer assembly 80 into the laser amplifier 90, the final reduction in beam path angles in the amplifier 90 as compared with a configuration not using an expander/reducer assembly 80, is very substantial. Referring again to FIG. 2, inside the gain region 92 of the amplifier 90 the pulses 70 are amplified by the process of stimulated emission. The amplifier 90 has a forward gain G such that when the pulses 70 exit the amplifier 90 they are increased in intensity to a level of BG/4. As shown in FIG. 7, the polarization and propagation direction of the pulses 70 leaving the amplifier 90 are unchanged.

As shown in FIG. 2, upon exiting the amplifier 90, the pulses 70 pass through an expander/reducer assembly 100 identical to assembly 80, but with the order of the lenses reversed, i.e. upon exiting the amplifier 90, the pulses 70 first pass through a concave lens 102 and then through a convex lens 104. This reverses the process described above and the pulses 70 exit the assembly 100 decreased in width and having larger angles between the paths. The smaller beam dimensions outside the assembly 100 contribute to smaller beam path angles because the turning mirrors 110 can be smaller and closer together. The distance from the amplifier 90 out to the turning mirrors 110 is fixed by timing constraints as discussed below.

After exiting the assembly 100, the pulses 70 all travel the same distance out to and back from the turning mirrors 110. The distance to the mirrors 110 is chosen so that leading end of the pulse train has penetrated well into the gain region 92 of the amplifier 90 on the second pass before the trailing edge of the pulse train has completed its first pass through the amplifier 90. In this manner, energy can be extracted from the amplifier 90 continuously for almost forty-eight nanoseconds since the gain volume is completely filled with stimulating radiation from the master oscillator during this period.

The mirrors 110 turn each piece around so that on the second pass through the amplifier 90 each piece travels along an optical path different from the path taken on its first pass through the amplifier 90. FIG. 8 illustrates the optical path travelled by a typical pulse piece 71. Pulse piece 71 travels a delay path designated 59 and shown by the arrows. The delay path 59 begins after the mirror 56 which directs the piece 71 to another mirror 63 which deflects the pulse piece 71 at a predetermined angle toward the beam expander/reducer assembly 80. The piece 71 travels through the assembly 80 where it is reduced in angle and increased in width as described above. The piece exits the gain region 92 of the amplifier 90 increased in intensity to a level BG/4 and travels through lens assembly 100 which increases the angle of the optical path and narrows the beam dimensions of the piece 71. The piece then hits mirror 114 where it is deflected toward mirror 112. Mirror 112 is angled so that it will deflect the pulse piece 71 back through lens assembly 100, laser amplifier 90, and assembly 80 toward mirror 69.

Figure 9:
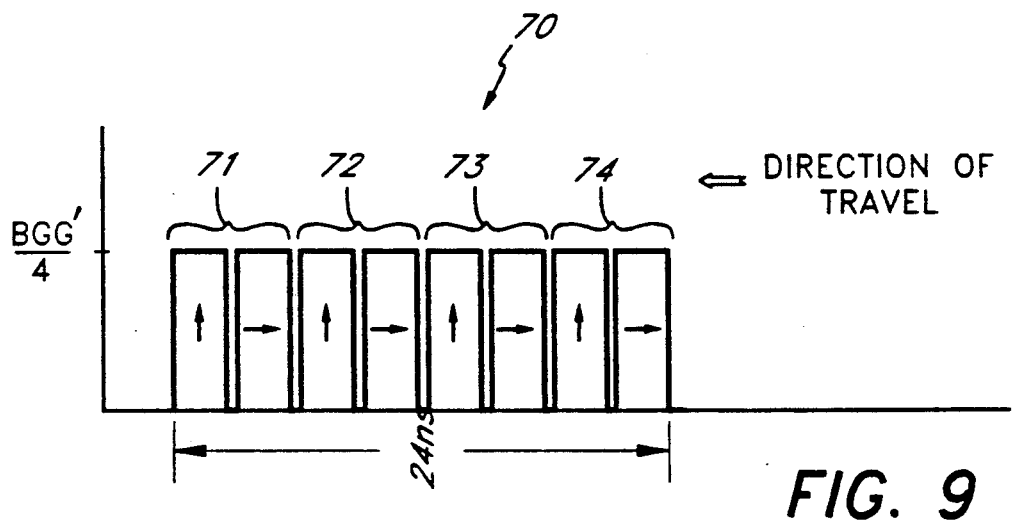
FIG. 9 is a diagram of the pulses after the second pass through the amplifier.

Referring to FIG. 2, on the second path through the amplifier, the lens assembly 100 now functions in the same manner as assembly 80 on the first pass, i.e., the incoming beams are widened and reduced in angle so that they fit the gain region 92 of the amplifier 90. The pulses experience a second increase in intensity. The gain region 92 has a second gain G' in the reverse direction such that the pulses have intensity BGG'/4 upon exiting the amplifier 90 as shown in FIG. 9. After exiting the amplifier 90, the pulses pass through assembly 80 which now functions to expand the angles between the beam paths and reduce the dimensions of the beams.

Upon leaving the assembly 80, each pulse 71, 72, 73, and 74 travels along a different path with a different length. The paths comprise mirrors 67 through 69 and 121 through 126 and are constructed so that the longest delay is given to the pulse piece which had previously received the least delay. In a similar manner, the least delay is now given to the pulse piece which had previously experienced the longest delay. For example, referring back to FIG. 8, the delay path of the returning pulse piece 71 which had previously received the least delay is designated 118. The pulse piece 71 exits out of the lens assembly 80 and encounters mirror 69. Mirror 69 deflects the pulse 71 toward mirror 121. Mirror 121 deflects the pulse toward mirror 125 which deflects the pulse toward the polarization recombiner 130.

Figure 10:
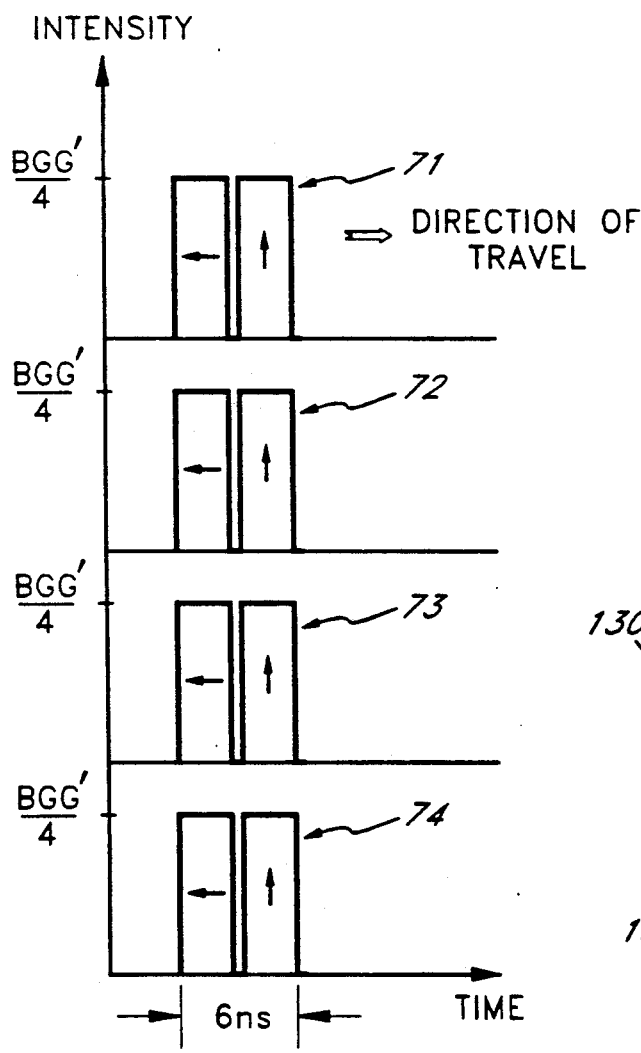
FIG. 10 is a diagram of the pulses before entering the polarization component recombination assembly of FIG. 2.

Thus, after travelling the second set of delay paths, the pieces 71, 72, 73, and 74 have all travelled the same total distance from their origin at beam splitter assembly 50 and all of the four six-nanosecond pulses 71, 72, 73, and 74, arrive at the polarization component recombiner assembly 130 at the same time. The pulses 71, 72, 73, and 74, are illustrated in FIG. 10 upon entering the assembly 130. The optical delay paths have removed all the separations in time such that the pulses 71, 72, 73, 74 are now travelling together in time. Furthermore, the pulses 71, 72, 73, and 74 have alternating polarization directions which have remained unchanged during the delay and amplification processes. The pulses have an intensity level of BG'/4 upon exiting the amplifier after the second pass and thus have this same intensity level upon entering the assembly 130.

Figure 11:
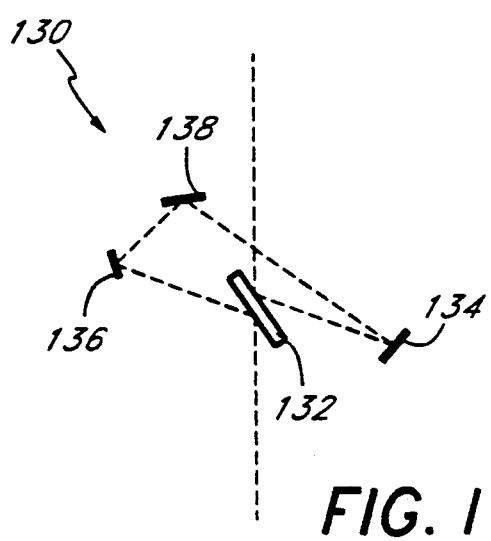
FIG. 11 is a side view of the polarization component recombination assembly of FIG. 2.

A side view of the assembly 130 is shown in FIG. 11. Referring to FIG. 3 and FIG. 11, the assembly 130 is similar to the polarization shifter assembly 34 but is rotated 90 degrees about the beam axis so that now the polarization component 25x which received the delay from the shifter assembly 34 is allowed to pass through while the previously undelayed polarization component 25y is required to follow the three-foot long path around the beam splitter 132. In other words, the polarizing beam splitter 132 is rotated 90 degrees so that it now passes pulses having polarization direction 23 and blocks those having polarization direction 27. Each pulse piece 71, 72, 73, and 74 comprises a pair of pulses having orthogonal polarization directions. The first pulse in the pair has polarization direction 27 and the second pulse has polarization direction 23. When each pair passes through the assembly 130, the first of the two three-nanosecond pulses is delayed just long enough so that the two components now overlie one another and form one three-nanosecond pulse on each of the four parallel paths exiting assembly 130.

As shown in FIG. 2, all four pulses arrive at the focussing lens 140 and the mirror 142 at the same time. The pulses are focussed at the same point on the target 144. The concentrated energy of the pulses focussed on target 144 effectively vaporizes the target material, raising it to such extreme temperatures that the vapor atoms are multiply ionized and X-rays are emitted when free electrons recombine with the ions in the plasma.

Figure 12:
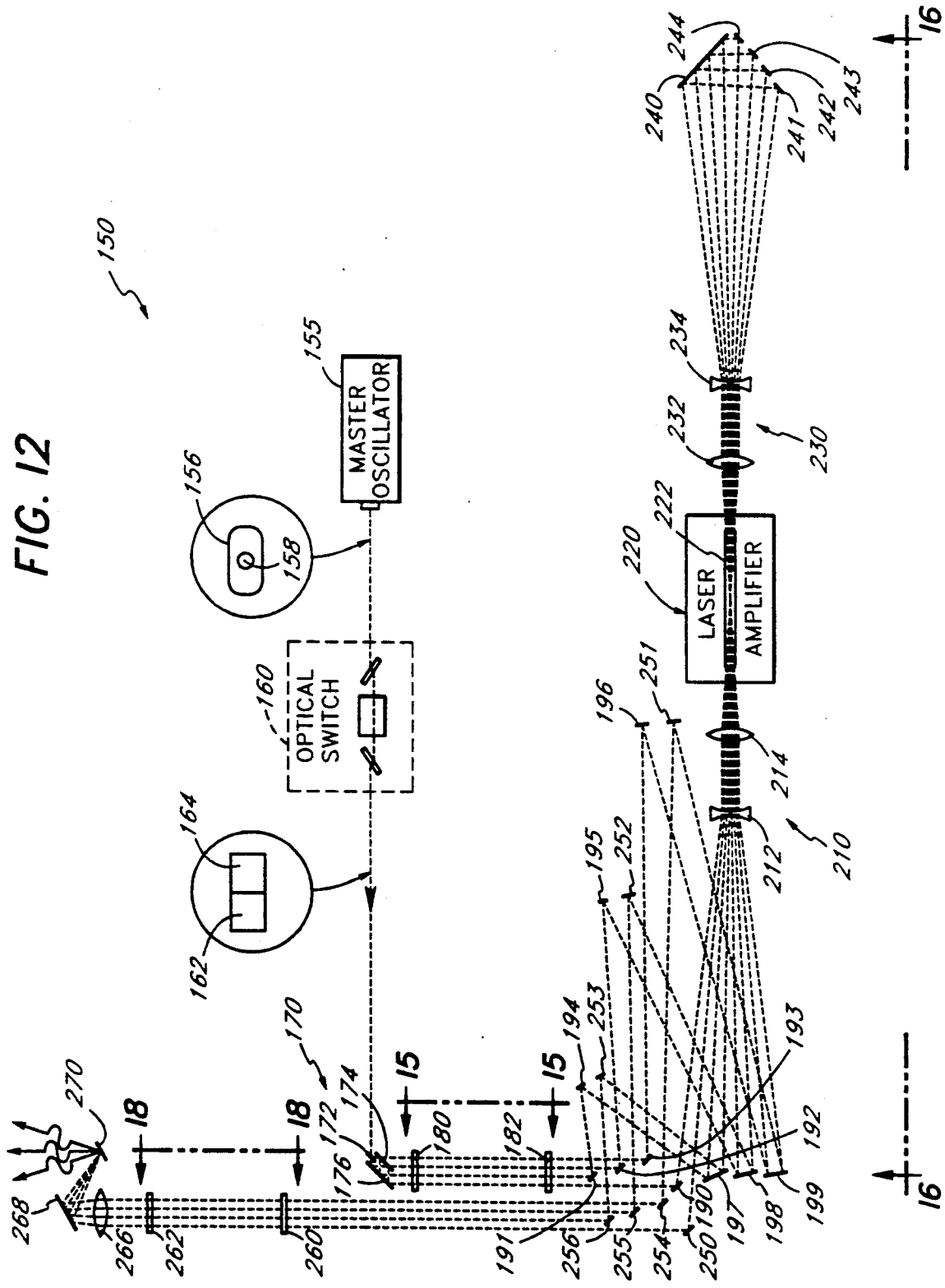
FIG. 12 is an illustration of a second embodiment of the present invention.

An alternative embodiment of the invention is shown in FIG. 12. A system 150 comprises a master oscillator laser 155 followed by an optical switch 160. An assembly 170 comprising two beam splitters, 172 and 174, and a mirror 176 is positioned to follow the switch 160. Two other mirrors 180 and 182 follow the assembly 170. A plurality of forward optical delay paths comprising mirrors 190 through 199 are located between the mirror 182 and an expander/reducer lens assembly 210. The assembly 210 comprises a concave lens 212 followed by a convex lens 214. A laser amplifier 220 having a gain region 222 is positioned between the assembly 210 and a second expander/reducer assembly 230. The assembly 230 comprises a convex lens 232 followed by a concave lens 234. A plurality of turning mirrors, labelled 240 through 244 follow the lens assembly 230. A plurality of reverse optical delay paths comprising mirrors 197 through 199 and 250 through 256 are located between the lens assembly 21 and two mirrors 260 and 262. Following the mirrors 260 and 262 is a focussing lens 266. A mirror 268 is positioned between the focussing lens 266 and a target 270.

The master oscillator 155 outputs a laser beam generally designed 156. The cross-section of the beam 156 is generally rectangular in shape and has a hollow portion 158 located towards the middle of the beam 156. The optical switch 160 is constructed so that it blocks the hollow portion 158 and separates the beam 156 from the master oscillator 155 into two distinct beams 162 and 164 which travel in parallel paths. The optical switch 160 further serves to trim each beam 162, 164 to a preferable three-nanosecond long template pulse, as in the first embodiment. After exiting the optical switch, the template pulses 162, 164 are still parallel optical paths. Although only one optical path travelled by template pulse 162 is shown, those skilled in the art will recognize that another optical path is travelled by the second template pulse 164 such that the template pulses 162, 164 travel in parallel planes and the beam array as viewed along the direction of travel is as shown in the inset of FIG. 12.

Figure 13:
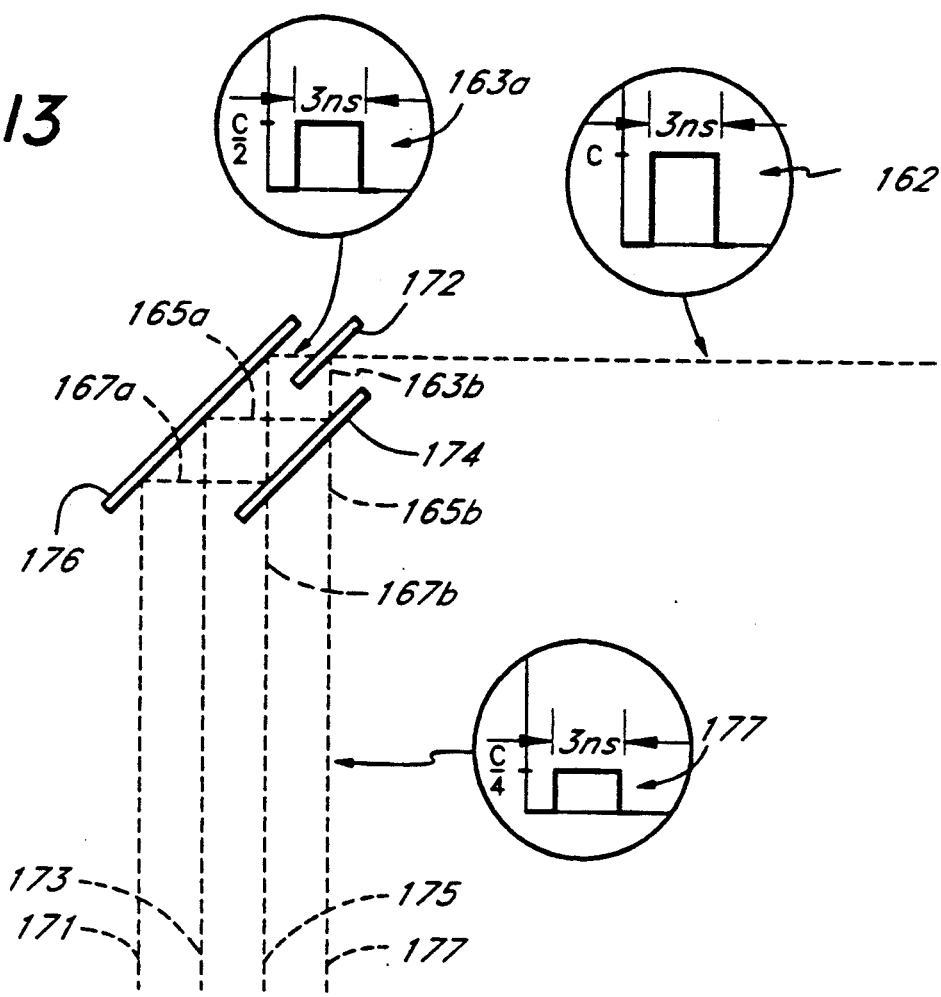
FIG. 13 is an enlarged view of the beam splitter assembly shown in FIG. 12.
Figure 14:
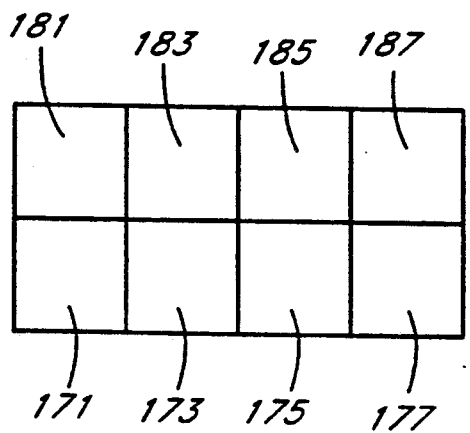
FIG. 14 is a diagram of the beam array of the pulses after exciting the assembly of FIG. 13 as viewed along the direction of travel of the pulses.

Upon entering the beam splitter assembly 170, shown enlarged in FIG. 13, the template pulses 162 and 164 travel in parallel optical paths as described above. As explained hereinafter, the beam splitter assembly 170 produces four pulses from each entering template pulse 162, 164, i.e., a total of eight pulse emerge from assembly 170, which are identical in length and intensity. The effects of the assembly 170 are explained with reference to incoming pulse template 162, however, it should be understood that the effects of the assembly 170 are identical on incoming template pulse 164, travelling in a parallel plane. Template pulse 162 enters with intensity C and first encounters beam splitter 172 which splits the template pulse 162 in two pulses 163a and 163b and reduces the intensity by a factor of approximately two. Pulse 163a thus has an intensity of approximately C/2 as shown. Pulse 163b is identical to pulse 163a. Pulse 163b then enters beam splitter 174 where it is again split into two pulses 165a and 165b and reduced in intensity by one half. Pulse 165b then exits the assembly at the far right as pulse 177. Pulse 165a is deflected off the mirror 176 at a 90 degree angle and then exits the assembly as pulse 173. Pulse 163a is deflected off mirror 176 at a 90 degree angle towards beam splitter 174 where it is split into two pulses 167a and 167b reduced in intensity by approximately one half. Pulse 167b exits the assembly as pulse 175. Pulse 167a encounters mirror 176 and is deflected 90 degrees, exiting the assembly at the far left as pulse 171. Each pulse exiting the assembly has been reduced resulting in the pulse exiting with approximately half the intensity level of when it entered. Since each pulse began with an intensity level C, the resulting intensity level is now approximately C/4. Pulse 177 is shown after exiting the assembly. The remaining pulses 171, 173, and 175, are identical. The effects of the assembly are identical on entering pulse 164, travelling an optical path parallel to pulse 162 in a plane parallel to the plane of FIGS. 12 and 16. Pulse 164 exits the assembly in four pulses 181, 183, 185, and 187, each having a three-nanosecond duration and an intensity level of approximately C/4. FIG. 14 shows the beam array of the pulses after exiting the assembly 170 as viewed along the direction of travel of the pulses. The pulses are travelling together in time along eight different paths, four parallel paths in one plane and four parallel paths in a second plane, located below the first plane, wherein the first and second planes are parallel.

Figure 15:
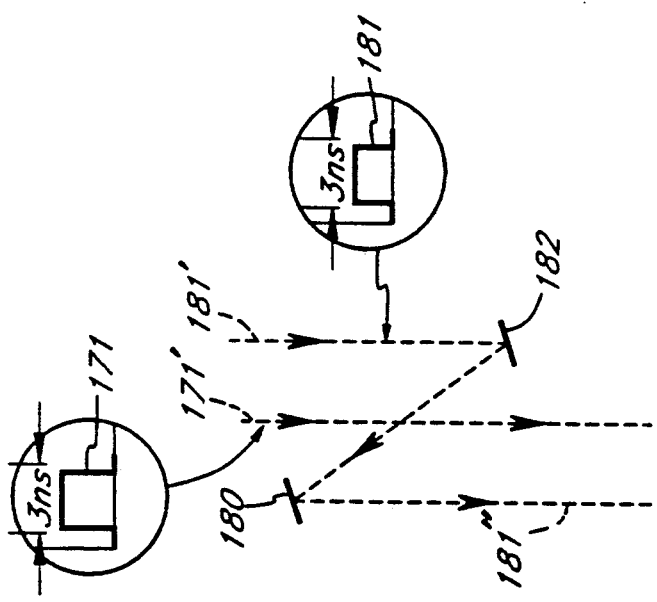
FIG. 15 is a view of the first set of delay mirrors as taken along line 15—15 of FIG. 12.

The pulses next encounter a pair of mirrors 180 and 182. As shown in FIG. 15, taken along line 15—15 of FIG. 12, the pulses 181, 183, 185, and 187 travelling in the lower plane encounter mirror 182 and are deflected up towards mirror 180. When the pulses reach mirror 180 they are deflected into a third plane, again parallel with respect to the original two planes of travel. For example, pulse 171 travels along optical path 171' and pulse 181 travels along optical path 181/40 . Pulse 181 encounters mirror 182 and is deflected back toward mirror 180. Mirror 180 deflects the pulse 181 in a direction represented by optical path 181''. The mirrors 180 and 182 are angled such that entering optical path 181' and exiting optical path 181'' of the pulse 181 are parallel. Thus, the mirrors 180, 182 delay the pulses 181, 183, 185, and 187 with respect to the pulses 171, 173, 175, and 177 and also move the pulses 181, 183, 185, and 187 into another plane in front of and parallel to the plane travelled by pulses 171, 173, 175, and 177.

After passing the mirrors 180 and 182, the pulses encounter a group of forward optical delay paths comprising mirrors 190 through 199. Mirrors 190, 197, 198, and 199 are double mirrors which have a slight angle with respect to one another such that pulses from each of the two planes incident upon the mirrors will be deflected into converging planes. The double mirrors are configured such that these planes converge inside the gain region of the amplifier and thus cause the pulses travelling on both planes to enter the gain region sequentially, as in the first embodiment.

Figure 16:
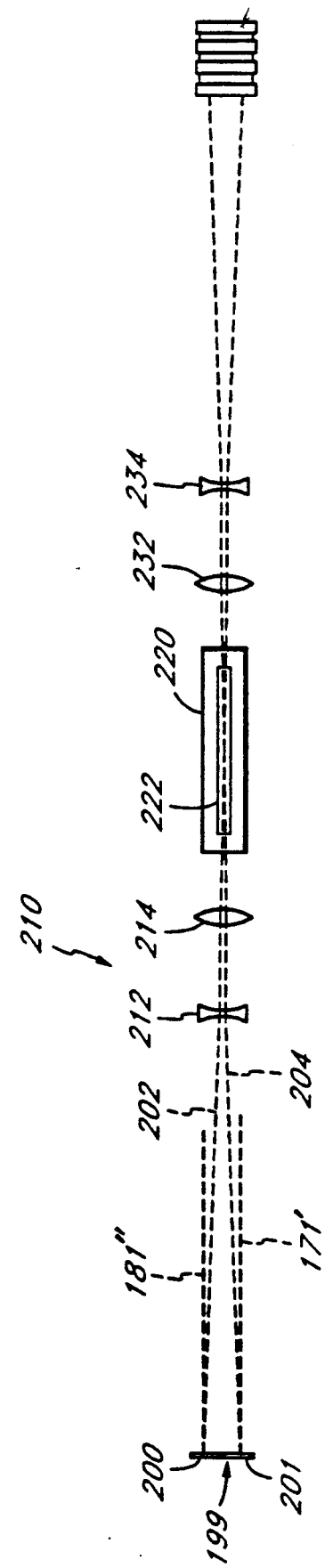
FIG. 16 is a view of a typical optical path taken along line 16—16 of FIG. 12.

FIG. 16, taken along line 16—16 of FIG. 12, best illustrates the effects of the double mirrors upon the incoming pulses. In this view, lines 181'' and 171' represent incoming optical paths travelled by pulses 181 and 171 respectively. Recall that mirror 180 and 182 introduced a delay in pulse 181 with respect to pulse 171 such that pulse 171 is travelling ahead in time of pulse 181. Path 181'' is in an upper plane with respect to path 171' and is parallel to path 171'. When pulse 181 contacts the top mirror 200 of double mirror 199 it is deflected along line 202 towards the expander/reducer assembly 210. In a similar manner, pulse 171 contacts the bottom mirror 201 of double mirror 199 and is deflected along line 204 towards assembly 210. Optical paths 202 and 204 are now in converging planes. The mirrors 201 and 202 are positioned so that the paths 202 and 204 converge inside the gain region 222 of the amplifier 220. In this manner, pulse 171 will pass through the gain region 222 followed thereafter by pulse 181. Proper positioning of the mirrors 190, 197, and 198 produces this same effect in the other pulses 173, 175, 177, 181, 183, 185, and 187 enter the gain region 222 of the amplifier 220 in a sequential pulse train, stacked end-to-end.

Figure 17:
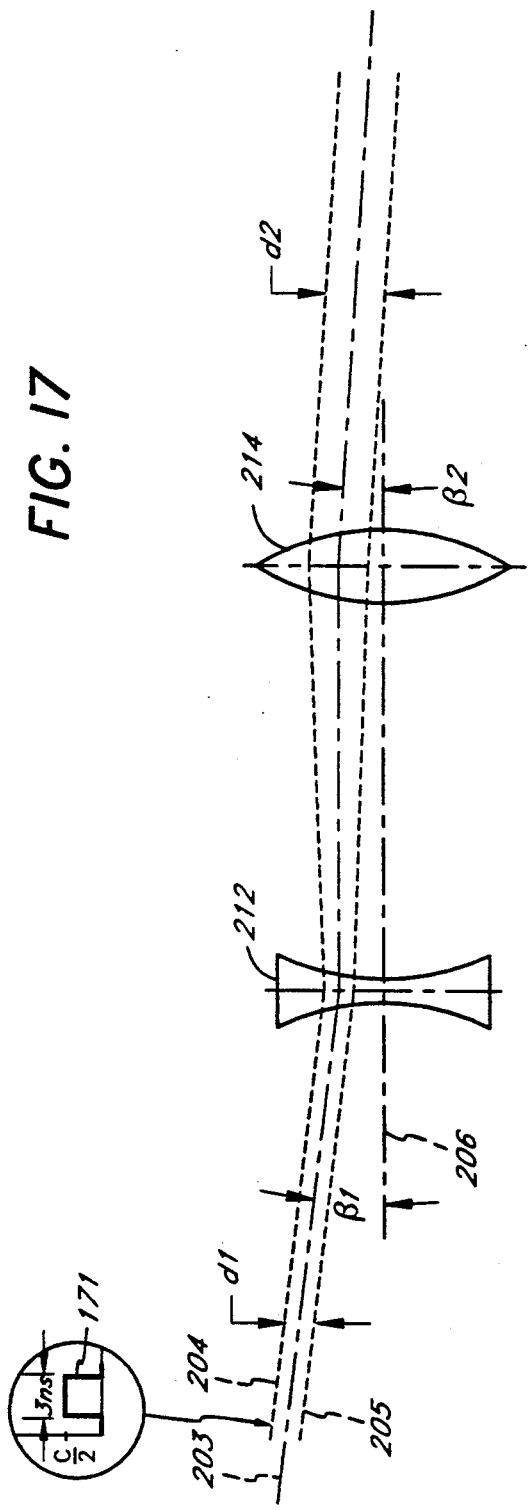
FIG. 17 is an enlargement of the beam expander/reducer assembly shown in FIG. 12.

Referring to FIG. 17, the lens assembly 210 is shown enlarged. The lenses 212 and 214 are positioned such that the focal points of the lenses 212 and 214 coincide. The combination of the convex lens 212 followed by the concave lens 214 in assembly 210 serves to reduce the angles between the incoming beam paths while also producing an increase in the width of the beams as they travel through the laser gain region 222, allowing beams of small width and height outside the amplifier 220 to closely fit the gain region 222 when inside the amplifier 220. For example, pulse 171 enters the concave lens 212 along an optical path 203 and comprises a collimated beam of parallel rays whose width is defined by rays 204 and 205. The pulse 171 enters the concave lens 212 at a first angle $\beta 1$ with respect to the optical axis 206 and has width d1. After exiting the convex lens 214, the pulse 171 has an angle $\beta 2$ with respect to the optical axis 206 such that $\beta 2$ is less than $\beta 1$. In addition, the pulse 171 now has a width d2 upon exiting the lens 214 which is greater than d1. In accordance with the properties of the lenses 212, 214, the change in angle is inversely proportional to the change in width of the incoming beams. The effects of the lenses 212 and 214 are the same for the other incoming pulses 173, 175, 177, 181, 183, 185, and 187 and thus make it much easier to fit the many angled beams to the gain region 222 of the amplifier 220.

Referring again to FIG. 12, the reduction in angles between the beam paths further ensures that the eight separate paths will fit through the amplifier 220 without striking the electrodes inside the gain region 222. Striking the electrodes is disadvantageous since energy is lost from the beam and because the portion of the gain region 222 shadowed by the electrode is not filled with the beam. Inside the gain region 222, the pulses are amplified by the process of stimulated emission. The amplifier 220 has a forward gain of F such that when the pulses exit the amplifier, they are increased in intensity to a level of approximately CF/4. Upon exiting the amplifier 220, the pulses then encounter the second expander/reducer lens assembly 230. Lens assembly 230 reverses the effects of assembly 210. The convex lens 232 is followed by a concave lens 234 so that the combination increases the angles between the beam paths and decreases the dimensions of the beams, allowing for easier distinction between the beam paths.

After exiting the assembly 230, the pulses all travel the same distance out to and back from the turning mirrors 240 through 244. The distance to the mirrors 240 through 244 is chosen so that the leading end of the pulse train has penetrated well into the gain region 222 of the amplifier 220 on the second pass before the trailing end has completed its first pass through the amplifier 220. In this manner, energy can be extracted from the amplifier 220 during the entire forty-eight nanosecond excited period.

The mirrors 240 through 244 turn each pulse around so that each pulse travels along a different optical path on the second pass through the amplifier 220. The double mirror 240 acts to deflect the incoming divergent paths into convergent paths which will again intersect in the gain region 222 of the amplifier, and thus acts similarly to double mirror 199 as described above. Additionally, the double mirror 240 and single mirrors 241, 242, 243, and 244 act to deflect the incoming beams on different optical paths through the amplifier 220 such that the pulse entering on the optical path with the least amount of forward delay exits on a path which will receive the largest amount of reverse delay.

On the second pass through the amplifier 220, the lens assembly 230 now functions as the expander/reducer assembly 210 did on the first pass through the amplifier 220, i.e., the incoming beams are widened and reduced in angle such that the beams fit the gain region 222 of the amplifier 220 while filling the maximum volume of the gain region 222. The gain region 22 has a second gain F' on the second pass such that the pulses have an intensity CFF'/4 upon exiting the amplifier 220. After exiting the amplifier 220, the pulses pass through assembly 210 which now functions to expand the angles between the beam paths and reduce the dimensions of the beams so that smaller angles can be used to separate the return delay paths.

Upon leaving the assembly 210, the pulses travel along reverse delay paths comprised of mirrors 197, 198, 199 and 250 through 256. The reverse delay paths are constructed such that the longest delay is given to the pulse which had previously received the least delay, and correspondingly, the pulse which had received the most delay is given the least amount of reverse delay. In this manner, after travelling the second set of delay paths, the pulses have all travelled the same total distance in delay paths. That is, the pulses 171, 173, 175, and 177 are travelling parallel in time and likewise pulses 181, 183, 185, and 187 are travelling parallel in time. However, the group of pulses 171, 173, 175, and 177 are separated from the group of pulses 181, 183, 185, and 187 by a time delay of three nanoseconds.

Figure 18:
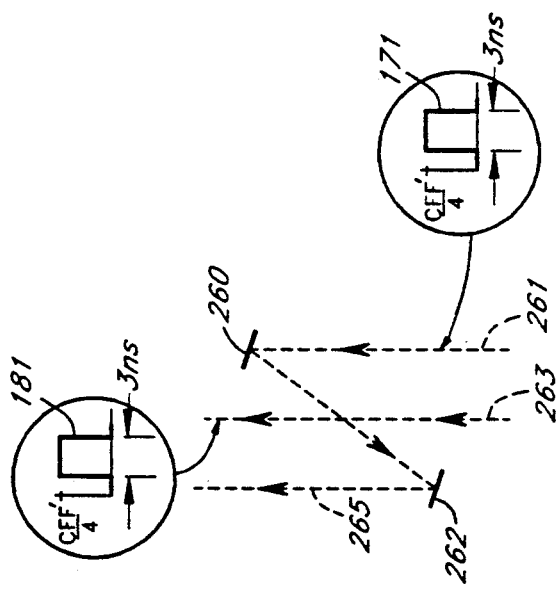
FIG. 18 is a view of the second set of delay mirrors taken along lines 18—18 of FIG. 12.

The pulses arrive at the mirrors 260 and 262 along eight different optical paths in two parallel planes, for a total of eight pulses in eight optical paths. Mirrors 260 and 262 reverse the effects of mirrors 180 and 182. The pulses incident upon mirror 262 are deflected toward a plane parallel with respect to the original plane of travel. For example, as shown in FIG. 18, taken along line 18—18 of FIG. 12, pulse 171 travels along optical path 261 while pulse 181 travels along optical path 263. Pulse 171 is incident upon mirror 260 and deflected back towards mirror 262. Mirror 262 deflects the pulse 171 in a direction represented by optical path 265 wherein path 265 is parallel to both paths 261 and 263. In this manner, the mirrors 260 and 262 are able to compensate for the delays introduced into pulses 181, 183, 185, and 187 by the mirrors 180 and 182 by delaying pulses 171, 173, 175, and 177. Thus after exiting the mirrors 260 and 262, the pulses are all travelling together in time along eight optical paths in two parallel planes, there being four optical paths in each plane.

Referring again to FIG. 12, the pulses next encounter focussing lens 266 and mirror 268 which, as in the first embodiment, focus the incoming pulses on the plasma target 270, where the concentrated energy contained in the pulses vaporizes the target material and X-rays are emitted.

FIGS. 19A, 19B, and 19C show the system 150 of the second embodiment in a compact configuration 300. This configuration overcomes the physical limitations imposed by the long optical delay paths of system 150. In the configuration 300, mirror 275 directs the pulses after mirrors 180 and 182 toward a group of mirrors designated 277 through 284. A group of mirrors comprising a double mirror 290 and single mirrors 291 and 292 is positioned to one side of mirrors 277 through 284. Another group of mirrors comprising single mirrors 293 through 296 is located on the side of the mirrors 277 through 284 opposite mirrors 290, 291, and 292. The three groups of mirrors, comprising individual mirrors 280 through 296, function to introduce and remove the optical delays. Four other mirrors 285, 286, 287, and 288 direct the pulses from the forward optical delays to the amplifier 220 and then onto the turning mirrors 241, 242, 243, 244, and 246. The turning mirrors turn the pulses around in the manner described above and then the pulses are directed by mirrors 285, 286, 287, and 288 through the laser amplifier 220 to the reverse optical delay paths. After travelling along the reverse delay paths, the pulses are directed by mirror 276 towards mirrors 260 and 262, and then on towards the target 270.

The laser plasma X-ray source of the present invention may be used in accordance with a photolithographic system. Referring to FIG. 1, the X-ray beam may be positioned such that the beam is incident upon a mask 17 having a sensitize portions of a resist layer 16 on substrate 15. A development process subsequently removes portions of the resist 16 in a pattern matching the original pattern 19 of the mask 17.

One class of laser amplifiers suitable for use in any of the above described embodiments is generally referred to as a discharged-pumped laser. One example of such a laser is an excimer laser having xenon chloride (XeCl) as the active material in the lasing medium. One characteristic of such excimer lasers is that they have very short excited-species lifetimes, typically on the order of a few nanoseconds.

In order to maximize the amount of energy extracted from the excited lasing medium of an excimer laser and to effectively compete against the wasteful collision processes which will otherwise rapidly consume the energy stored in the excited molecules, it is often advantageous to keep the excited region completely filled with the stimulating radiation from the master oscillator for the duration of the excitation. This is illustrated in the above described embodiments wherein the short pulse elements which form the pulse train are stacked end-to-end with very small gaps or no gaps left between the individual pulses as they pass through the amplifier. For example, for a pulse train where the individual pulses are separated by approximately three nanoseconds, the duration of each pulse might also be approximately three nanoseconds, thus leaving little or no space between adjacent pulses comprising the pulse train.

Alternatively, since the lifetime of the excited species in an excimer laser, as well as other types of discharge-pump lasers, can be as long as several nanoseconds, it is possible to substantially improve the amount of pulse compression in accordance with the present invention by trimming the master-oscillator pulse to a length which is less than the length of time between adjacent pulses. For example, for a pulse train where the individual pulses are separated by three nanoseconds, the duration of each pulse might be two nanoseconds, thus leaving a one nanosecond space between adjacent pulses. The amount of energy lost from quenching of the excited states of the gain molecules during the one nanosecond gaps may be acceptable for many applications in light of the significant improvement in pulse compression.

A general guideline which may be used to determine the spacing between adjacent pulses is as follows: the space between adjacent pulses should be less than or equal to a distance in space determined by multiplying the speed of light times the energy-storage time of the gain medium.

Although the invention has been described in terms of a preferred embodiment, it will be apparent to those skilled in the art that numerous modifications can be made without departing from the spirit and scope of the claims appended hereto. Such modifications are intended to be included within the scope of the claims.

What is claimed is:

1. An X-ray lithography process comprising the steps of:
    producing a laser pulse having a first time width;
    transferring energy from a lasing medium which is excited in pulses having a duration equal to an excitation time period to said laser pulse wherein said laser pulse first time width is less than said excitation time period thereby amplifying said laser pulse;
    bombarding a target material with said amplified laser pulse to produce a plasma from which X-rays are emitted; and
    exposing a mask/X-ray-resist substrate combination to said X-rays to replicate a desired pattern on said substrate.

2. The method defined in claim 1 wherein, said step of producing a laser pulse comprises:
    outputting a laser pulse from a master oscillator having a first time duration; and
    trimming said duration of said pulse from said master oscillator to said first time period.

3. The method defined in claim 1, wherein said step of transferring energy from a laser medium comprises passing said pulse through a gain region of a laser amplifier.

4. An X-ray lithography system comprising:
    a laser pulse generator for making a template laser pulse, said template laser pulse having a time duration equal to a first time period;
    a laser amplifier medium having an excited region which is excited for a time duration equal to a second time period wherein said second time period is longer than said first time period, such that when said template pulse propagates in said excited region of said medium, energy is transferred from said laser medium to said template pulse thereby increasing the energy of said template pulse producing an amplified template pulse having a time duration substantially equal to said first time period;
    an optical transport system for delivering said amplifying template pulse to a target material causing said target material to form a plasma from which X-rays are emitted;
    a substrate;
    an X-ray resist positioned on said substrate; and
    a mask positioned over said resist, wherein said mask has a pattern which, when said X-rays are incident upon said mask, exposes portions of said resist to said X-rays thereby sensitizing said exposed portions of said resist.

5. An X-ray lithography system as defined in claim 4 further comprising a pulse train generator for generating a series of sequential pulses from said template pulse, wherein said series of sequential pulses has a total time duration equal to a third time period which is greater than said first time period.

6. An X-ray lithography system as defined in claim 5 wherein said pulse train generator comprises:
    a beam splitter for dividing said template pulse into a plurality of secondary template pulses which propagate along a plurality of optical paths; and
    an optical delay for introducing time delays between at least two of said secondary template pulses.

7. An X-ray lithography system as defined in claim 6 wherein said optical delay comprises a plurality of optical delays wherein each of said plurality of delays has a time duration equal to an integral multiple of said first time period.

8. An X-ray lithography system as defined in claim 4 wherein said laser amplifier medium is an excimer laser.

9. An X-ray lithography system comprising:
    a pulse train generator which creates a pulse train comprising a series of individual pulses which are sequential in time;
    a laser amplifier medium having an excited region wherein energy is transferred from said laser medium to said pulse train when said pulse train propagates through said excited region;
    a pulse encoder which encodes each of said individual pulses comprising said pulse train;
    a pulse train compressor for transforming said pulse train from a series of pulses sequential in time to a group of pulses coincident in time;
    a target;
    an optical transport system for delivering said coincident in time pulses to a common location on said target thereby forming a plasma from which X-rays are emitted;
    means for replicating an image wherein said means includes a substrate having an X-ray resist positioned thereon and a mask containing an image to be replicated, said mask positioned over said resist such that said X-rays are incident upon said mask thereby replicating said image on said resist.

10. An X-ray lithography system as defined in claim 9 wherein said pulse encoder comprises an angle encoder which defines a plurality of optical paths wherein each of said plurality of paths forms a different angle with respect to an axis of said laser amplifier excited region and wherein different individual paths transmit different ones of said individual pulses of said pulse train through said excited region.

11. An X-ray lithography system as defined in claim 10 wherein said angle encoder further comprises a convex lens having a focal point at a first focal length and a concave lens having a focal point at a second focal length.

12. An X-ray lithography system as defined in claim 11 wherein said second focal length is less than said first focal length.

13. An X-ray lithography system as defined in claim 11 wherein said convex lens focal point substantially coincides with said concave lens focal point.

14. An X-ray lithography system as defined in claim 9 wherein said pulse encoder comprises a polarization encoder which identifies individual pulses by their polarization.

15. An X-ray lithography system as defined in claim 9 wherein said laser amplifier medium is an excimer laser.

16. An X-ray lithography system comprising:
a high power pulsed laser having a first pulse length;
a pulse compressor for compressing the temporal width of said pulsed laser to produce an energetic laser pulse having a second pulse length wherein said second pulse length is smaller than said first pulse length;
a target;
an optical transport system for delivering said energetic laser pulse to a location on said target thereby forming a plasma from which X-rays are emitted; and
a mask and X-ray resist substrate combination wherein said X-rays are incident upon said combination to replicate a desired pattern on said substrate.

17. An X-ray lithography system as defined in claim 16 wherein said high powered pulsed laser comprises a repetitively pulsed excimer laser.

18. An X-ray lithography system as defined in claim 16 further comprising a master oscillator which produces a template pulse having a third pulse width wherein said template pulse is amplified by said high power pulsed laser to produce said energetic laser pulse having a pulse width substantially equal to said third pulse width.

19. An X-ray lithography system as defined in claim 18 further comprising a pulse trimmer for trimming said template pulse.

20. An X-ray lithography system as defined in claim 19 wherein said pulse trimmer further comprises a Pockels cell and a polarizer.

21. An X-ray lithography system as defined in claim 19 wherein said pulse trimmer further comprises a dielectric breakdown optical switch.

22. An X-ray lithography system as defined in claim 19 wherein said pulse trimmer further comprises a saturable absorber optical switch.

23. An X-ray lithography system as defined in claim 18 further comprising a splitter for splitting said template pulse into a plurality of secondary pulses and a delay for giving said plurality of secondary pulses a plurality of delay times so that said plurality of secondary pulses can be passed through said high power pulsed laser sequentially.

24. An X-ray lithography system as defined in claim 23 further comprising a pulse assembler for reassembling said plurality of secondary pulses to produce said energetic laser pulse.

25. An X-ray lithography system as defined in claim 23 further comprising reversing optics for causing said plurality of secondary pulses to be passed sequentially through said high power pulsed laser more than once.

26. An X-ray lithography system as defined in claim 25 further comprising a pulse assembler for reassembling said plurality of secondary pulses to produce said energetic laser pulse.

27. An X-ray lithography system as defined in claim 25 further comprising a time delay which causes a trailing pulse of said plurality of secondary pulses and a leading pulse of said plurality of secondary pulses to overlap in a gain region of said high power pulsed laser for a period of time which ensures that extraction of energy from said gain region proceeds in a continuous manner during the period of time the gain region is occupied by the multiple passes of said plurality of secondary pulses.

28. An X-ray lithography system as defined in claim 23 further comprising an angle encoder which defines a plurality of optical paths through a gain region of said high power pulsed laser, said plurality of optical paths configured so that said plurality of secondary pulses are distinguished and separated one from the other by means of the differing path angles through said gain region.

29. An X-ray lithography system as defined in claim 23 further comprising a polarization encoder which enables said plurality of secondary pulses to be distinguished and separated one from the other as they pass through said gain region.

30. An X-ray lithography process comprising the steps of:
compressing the temporal width of a high energy pulsed laser having a first pulse length into an energetic laser pulse having a second pulse length wherein said second pulse length is smaller than said first pulse length;
directing said energetic laser pulse to a target thereby forming a plasma from which X-rays are emitted;
positioning a mask and X-ray resist substrate combination such that said X-rays are incident upon said combination, wherein said mask includes a pattern which, when said X-rays are incident upon said mask, exposes portions of said resist to said X-rays, thereby sensitizing said exposed portions of said resist.

31. A method of performing X-Ray lithography comprising the steps of:
exciting a laser material in pulses having a first pulse length;
extracting energy from said excited laser material in the form of an energetic laser pulse having a period which is smaller than said first pulse length;
directing said energetic laser pulse to a target thereby forming a plasma from which X-rays are emitted; and
directing said X-rays at a substrate having an X-ray resist positioned thereon and a mask containing an image to be replicated, said mask positioned over said resist such that said X-rays are incident upon said mask thereby replicating said image on said resist.

32. An X-ray lithography process comprising the steps of:
  producing a laser pulse having a first pulse length;
  compressing the temporal width of said laser pulse to produce an energetic laser pulse having a second pulse length wherein said second pulse length is smaller than said first pulse length;
  providing a target;
  delivering said energetic laser pulse to a location on said target thereby forming a plasma which X-rays are emitted; and
  exposing a mask/X-ray resist combination to said X-rays to replicate a desired pattern on said substrate.

33. A method as defined in claim 32 wherein said compressing step further comprises the steps of:
  producing a template pulse;
  splitting said template pulse into a plurality of secondary pulses;
  delaying said plurality of secondary pulses a plurality of delay times to produce a pulse train having a pulse train period;
  sequentially passing said plurality of secondary pulses through an excited laser medium having an excitation period which is longer than said first pulse length thus increasing the energy of said secondary pulses; and
  reassembling said plurality of increased energy secondary pulses to produce said energetic laser pulse.

34. A method as defined in claim 33 further comprising the step of repeating said step of sequentially passing said plurality of secondary pulses through said excited laser medium.

35. An x-ray lithography process compressing laser pulses comprising the steps of:
  exciting a lasing medium having an energy-storage time period;
  producing a train of pulses wherein each pulse in said train has a width equal to a first time period and wherein adjacent pulses are separated by a period of time equal to a second time period wherein said second time period is no greater than said energy-storage time period of said lasing medium;
  transporting said train of pulses through said lasing medium; and
  exposing a substrate to said X-rays, said substrate including an X-ray resist having a mask positioned thereon wherein said mask includes a pattern to be replicated, said X-rays incident upon said mask such that said pattern is replicated on said resist.

* * * * *